US012787663B2

(12) United States Patent
Biard et al.

(10) Patent No.: US 12,787,663 B2
(45) Date of Patent: Nov. 3, 2026

(54) METHOD FOR MANUFACTURING A COMPOSITE STRUCTURE COMPRISING A THIN FILM OF MONOCRYSTALLINE SIC ON A CARRIER SUBSTRATE OF POLYCRYSTALLINE SIC

(71) Applicant: Soitec, Bernin (FR)

(72) Inventors: Hugo Biard, Bernin (FR); Ionut Radu, Bernin (FR); Frédéric Allibert, Bernin (FR)

(73) Assignee: Soitec, Bernin (FR)

( * ) Notice: Subject to any disclaimer, the term of this patent is extended or adjusted under 35 U.S.C. 154(b) by 351 days.

(21) Appl. No.: 18/697,809

(22) PCT Filed: Sep. 21, 2022

(86) PCT No.: PCT/FR2022/051774
§ 371 (c)(1),
(2) Date: Apr. 2, 2024

(87) PCT Pub. No.: WO2023/057700
PCT Pub. Date: Apr. 13, 2023

(65) Prior Publication Data

US 2025/0006492 A1 Jan. 2, 2025

(30) Foreign Application Priority Data

Oct. 7, 2021 (FR) ....................................... 2110624
Oct. 7, 2021 (FR) ....................................... 2110626

(51) Int. Cl.
*H10P 14/20* (2026.01)

(52) U.S. Cl.
CPC ...... *H10P 14/3408* (2026.01); *H10P 14/2904* (2026.01); *H10P 14/3802* (2026.01)

(58) Field of Classification Search
CPC ............ H10P 14/3408; H10P 14/2904; H10P 14/3802; H10P 10/12; H10P 10/126; H10P 95/00; H10P 90/00; H10P 19/1904
See application file for complete search history.

(56) References Cited

U.S. PATENT DOCUMENTS

2003/0129780 A1* 7/2003 Auberton-Herve .......................... H10P 90/1916 438/455
2005/0151155 A1 7/2005 Auberton-Herve
2017/0330747 A1 11/2017 Akiyama

FOREIGN PATENT DOCUMENTS

DE 102007021991 A1 11/2008
EP 0755068 A2 1/1997
(Continued)

OTHER PUBLICATIONS

Korean Office Action for Application No. 10-2024-7014814 dated Feb. 3, 2026, 13 pages with machine translation.
(Continued)

*Primary Examiner* — Hoang-Quan Ho
(74) *Attorney, Agent, or Firm* — TraskBritt

(57) ABSTRACT

A method of fabricating a composite structure including a thin layer of single-crystal silicon carbide on a polycrystalline silicon carbide carrier substrate includes providing an initial substrate of single-crystal silicon carbide and a carrier substrate of polycrystalline silicon carbide. A porous layer is formed on the initial substrate, and a superficial layer of amorphous silicon carbide is formed on the carrier substrate and/or on the porous layer. The initial substrate and the carrier substrate are joined to form a first intermediate structure, which is heat treated at an elevated temperature to crystallize the superficial layer, at least partly in the form of single-crystal silicon carbide, to form the thin layer and to form a second intermediate structure, which is separated in
(Continued)

the porous layer to form the composite structure and a remainder of the initial substrate.

20 Claims, 4 Drawing Sheets

(56) References Cited

FOREIGN PATENT DOCUMENTS

| | | | | |
|---|---|---|---|---|
| JP | 10-297996 | A | | 11/1998 |
| JP | 1998297996 | | * | 11/1998 |
| JP | 2001-332492 | A | | 11/2001 |
| KR | 10-2003-0047900 | A | | 6/2003 |

OTHER PUBLICATIONS

Gautier et al., Electrochemical Formation of Porous Silicon Carbide for Micro-Device Applications, Material Science Forum, vol. 924, (2017), pp. 943-946.
International Written Opinion for Application No. PCT/FR2022/051774 dated Dec. 23, 2022, 5 pages.
International Search Report for Application No. PCT/FR2022/051774 dated Dec. 23, 2022, 2 pages.
Shishkin et al., Photoelectrochemical Etching of n-type 4H Silicon Carbide, Journal of Applied Physics vol. 96, (2004), 34 pages.

* cited by examiner

METHOD FOR MANUFACTURING A COMPOSITE STRUCTURE COMPRISING A THIN FILM OF MONOCRYSTALLINE SIC ON A CARRIER SUBSTRATE OF POLYCRYSTALLINE SIC

CROSS REFERENCE TO RELATED APPLICATIONS

This application is a national phase entry under 35 U.S.C. § 371 of International Patent Application PCT/FR2022/051774, filed Sep. 21, 2022, designating the United States of America and published as International Patent Publication WO 2023/057700 A1 on Apr. 13, 2023, which claims the benefit under Article 8 of the Patent Cooperation Treaty to French Patent Application Serial No. FR2110624, filed Oct. 7, 2021 and to French Patent Application Serial No. FR2110626, filed Oct. 7, 2021.

TECHNICAL FIELD

The present disclosure relates to the field of semiconductor materials for microelectronic components. The present disclosure relates, in particular, to a process for fabricating a composite structure comprising a thin layer of single-crystal silicon carbide on a carrier substrate made of polycrystalline silicon carbide.

BACKGROUND

SiC is increasingly widely used to fabricate innovative power devices, to meet the needs of growing fields of application of electronics, such as electric vehicles, in particular.

Power devices and integrated power-supply systems based on single-crystal silicon carbide are able to manage a much higher power density than their conventional silicon equivalents, and to do so with active regions of smaller size. In order to further limit the dimensions of power devices on SiC, it would be advantageous to fabricate vertical components rather than lateral components. To do this, vertical electrical conduction, between an electrode placed on the front face of the SiC structure and an electrode placed on the back face, must be permitted by the structure.

Nevertheless, high-quality single-crystal SiC (c-SiC) substrates intended for the microelectronics industry remain expensive and difficult to supply in large sizes. It is thus advantageous for layer transfer solutions to be used to produce composite structures typically comprising a thin layer of single-crystal SiC (obtained from the high-quality c-SiC substrate) on a lower cost carrier substrate, for example, made of polycrystalline SiC (p-SiC).

One well-known thin-layer transfer solution is the Smart Cut® process, which uses implantation of light ions in a single-crystal donor substrate, and joining by direct bonding, at a bonding interface, to a carrier substrate. The transfer of the thin layer, derived from the donor substrate, to the carrier substrate is carried out by way of a fracture along a buried weak plane generated by the implantation of light ions.

Another known transfer solution, in particular, for silicon substrates, is the Eltran® process, which involves a porous layer on which the thin single-crystal layer is grown epitaxially, and joining by direct bonding to the carrier substrate. The transfer of the thin layer to the carrier substrate is carried out by way of a separation in the porous layer.

BRIEF SUMMARY

The present disclosure relates to an alternative solution to those of the prior art. It relates to a process for fabricating a composite structure comprising a thin layer made of single-crystal SiC positioned on a carrier substrate made of polycrystalline SiC. It also relates to an intermediate structure obtained during the fabrication process.

The present disclosure relates to a process for fabricating a composite structure comprising a thin layer made of single-crystal silicon carbide positioned on a carrier substrate made of polycrystalline silicon carbide, the process comprising:

a) a step of providing an initial substrate made of single-crystal silicon carbide, having a front face and a back face, and a carrier substrate made of polycrystalline silicon carbide having a front face and a back face, b) a step of porosification applied to the initial substrate, in order to form a porous layer at least on the front face side of the initial substrate, c) a step of forming a superficial layer made of amorphous silicon carbide, on the front face of the carrier substrate and/or on the porous layer, d) a step of joining the initial substrate and the carrier substrate at their respective front faces, leading to the production of a first intermediate structure, e) a heat treatment step applied to the first intermediate structure, at a temperature above 900° C., in order to crystallize the surface layer, at least partly in the form of single-crystal silicon carbide, starting from a contact interface with the porous layer, in order to form the thin layer, step e) leading to the production of a second intermediate structure, f) a step of separation in the porous layer of the second intermediate structure, in order to obtain the composite structure on the one hand and the remainder of the initial substrate on the other hand.

According to other advantageous and non-limiting features of the present disclosure, taken individually or in any technically feasible combination:

- at the end of step b), the porous layer has a thickness of between 0.5 μm and 5 μm;
- at the end of step b), the porous layer comprises pores, the size of which is between 1 nm and 50 nm, and has a degree of porosification of between 10% and 70%;
- at the end of step c), the surface layer has a thickness of less than or equal to 10 μm;
- at the end of step c), the surface layer has a thickness of less than or equal to 1 μm, typically on the order of a hundred to several hundreds of nanometers;
- step c) comprises the deposition of an amorphous silicon carbide layer, at least on the front face side of the carrier substrate and/or at least on the porous layer, in order to form the surface layer(s);
- the amorphous silicon carbide layer deposited is highly doped and has a concentration of dopant species of greater than $10^{19}/cm^3$, or greater than $10^{20}/cm^3$;
- step c) comprises an amorphization of a surface layer of the carrier substrate, at least on the front face side thereof, in order to form the superficial layer;
- step d) comprises, prior to the joining of the initial substrate and the carrier substrate, the formation of a bonding layer on one and/or the other of the substrates, on the side of the respective faces thereof, the bonding layer having, after joining, a total thickness of less than or equal to 10 nm;
- the bonding layer is composed of at least one material chosen from silicon, nickel, titanium, and tungsten;
- during step e), a segmentation into nodules or a dissolution of the bonding layer allows direct contact, at least locally, between the superficial layer and the porous layer or between the superficial layer and the carrier substrate;

the heat treatment of step e) is carried out at a temperature above or equal to 1000° C., preferably above or equal to 1400° C., or above or equal to 1850° C.;

in step e), the crystallization of the superficial layer occurs at least partly in the form of polycrystalline silicon carbide, starting from a contact interface with the carrier substrate, in order to form an intermediate layer;

the fabrication process comprises, after step f), a finishing step g) comprising mechanical and/or chemical treatment(s) on the composite structure, in order to eliminate residues of the porous layer from the front face of the thin layer and/or to correct the thickness uniformity of the composite structure;

step g) comprises a heat treatment, applied to the composite structure, at a temperature of between 1000° C. and 1900° C., before or after the mechanical and/or chemical treatment(s);

the fabrication process comprises a step of reconditioning the remainder of the initial substrate for reuse as an initial substrate for fabrication of a new composite structure.

The present disclosure also relates to an intermediate structure comprising:

a carrier substrate made of polycrystalline silicon carbide, at least one superficial layer made of amorphous silicon carbide, positioned on the carrier substrate, on the front face side thereof, a porous layer positioned on the superficial layer, an initial substrate made of single-crystal silicon carbide on the porous layer, the porous layer being positioned, directly in contact or via a bonding layer, on the superficial layer, a bonding interface being present between the porous layer and the superficial layer, or the superficial layer being positioned, directly in contact or via a bonding layer, on the carrier substrate, a bonding interface being present between the carrier substrate and the superficial layer, or a superficial layer on the porous layer side being positioned, directly in contact or via a bonding layer, on another superficial layer on the carrier substrate side, a bonding interface being present between the two superficial layers.

BRIEF DESCRIPTION OF THE DRAWINGS

Other features and advantages of the present disclosure will become apparent on reading the following detailed description of example embodiments of the present disclosure, with reference to the appended figures, in which.

The figures are schematic representations that, for the sake of readability, have not been drawn to scale. In particular, the thicknesses of the layers along the z-axis are not to scale with respect to the lateral dimensions along the x- and y-axes. The relative thicknesses of the layers with respect to one another have not necessarily been respected in the figures.

DETAILED DESCRIPTION

Figure 1:
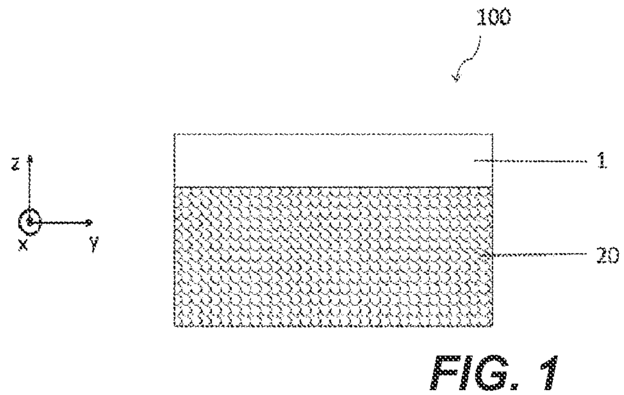
FIG. 1 shows a composite structure produced using a fabrication process in accordance with the present disclosure.

The present disclosure relates to a process for fabrication of a composite structure 100 comprising a thin layer 1 made of single-crystal silicon carbide (c-SiC will be used below to refer to single-crystal silicon carbide) positioned on a silicon carbide carrier substrate 20 (FIG. 1). The carrier substrate 20 is polycrystalline (p-SiC).

Figure 2A:
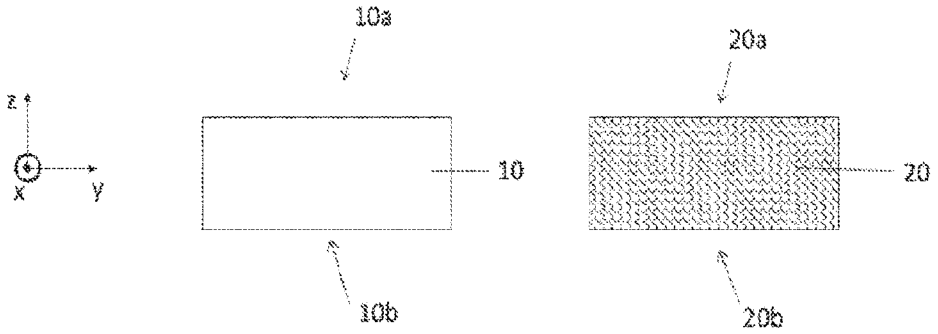
FIGS. 2A-2G show steps of fabrication processes in accordance with embodiments of the present disclosure.

The process first comprises a step a) of providing an initial substrate 10 made of single-crystal silicon carbide (FIG. 2A). The initial substrate 10 is preferably in the form of a wafer having a diameter of 100 mm, 150 mm, 200 mm or 300 mm, and a thickness typically of between 300 and 800 microns. The initial substrate 10 has a front face 10*a* and a rear face 10*b*. The surface roughness of the front face 10*a* is advantageously chosen to be less than 1 nm Ra (average roughness), measured by atomic force microscopy (AFM), for example, on a on a 20 micron×20 micron scan. The initial substrate 10 may be of 4H or 6H polytype, and may have n-type or p-type doping.

Step a) also comprises the provision of a carrier substrate 20 made of polycrystalline silicon carbide having a front face 20*a* and a back face 20*b* (FIG. 2A).

The carrier substrate 20 may be produced by a conventional technique such as sintering or chemical vapor deposition. The carrier substrate 20 is preferably in a form identical to that of the initial substrate 10, typically in the form of a wafer having a typical diameter and thickness mentioned above with reference to the initial substrate 10. The surface roughness of the front face 20*a* of the carrier substrate 20 is advantageously chosen to be less than 1 nm Ra, at least when this face is intended to be directly joined in a subsequent step d) of the process.

Figure 2B:
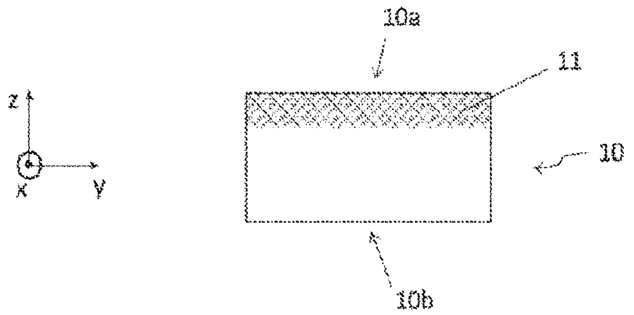

The process then comprises a step b) of porosification applied to the initial substrate 10, to form a porous layer 11 (FIG. 2B). The known methods of porosification of SiC, some of which are described or referenced in the publications by Y. Shishkin et al. ("Photoelectrochemical etching of n-type 4H silicon carbide," Journal of Applied Physics 96, 2311, 2004) and by Gautier et al. ("Electrochemical formation of porous silicon carbide for micro-device applications," Materials Science Forum, ISSN: 1662-9752, Vol. 924, pages 943-946, 2018) could be applied to the initial substrate 10 to form the porous layer 11.

Advantageously, the porous layer 11 has a thickness of between 0.5 μm and 5 μm. The degree of porosification is preferably between 10% and 70%, and the size of the pores is typically between 1 nm and 50 nm.

These characteristics are favorable, firstly to the crystallization in contact with the porous layer 11 (step e) of the process) of a layer 21 made of amorphous silicon carbide in single-crystal form, which layer is intended to form the thin layer 1 of the composite structure 100; secondly, the characteristics of the porous layer 11 are suitable for allowing and facilitating the separation within this layer, in a step f) of the process, while providing a sufficient mechanical strength during the previous steps.

The next step c) of the fabrication process according to the present disclosure corresponds to the formation of a superficial layer 21, 12 made of amorphous silicon carbide, at least on the front face 20*a*, 10*a* of the carrier substrate 20 or of the initial substrate 10.

Figure 2C:
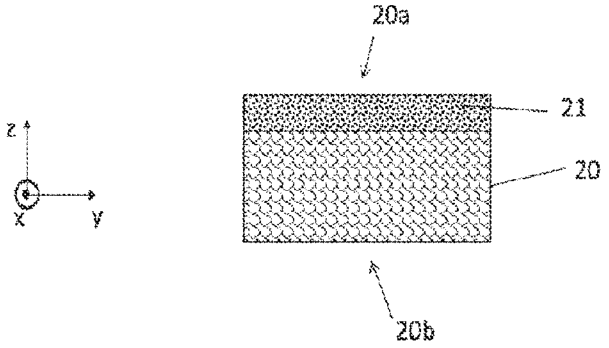
Figure 2C:
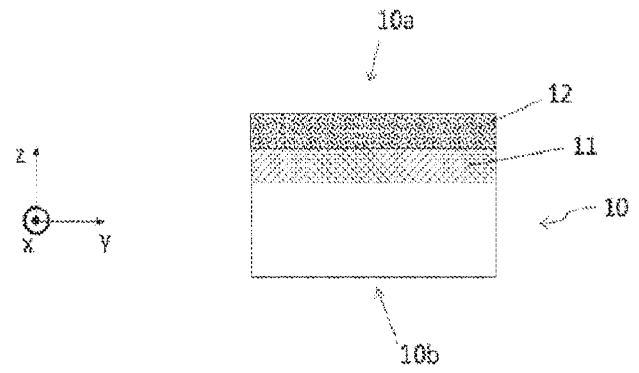

According to a first embodiment, it is the substrate 20 that is provided at least on the front face 20*a* thereof with the superficial layer 21 made of amorphous silicon carbide (a-SiC) (FIG. 2C).

According to a second embodiment, the superficial layer 12 made of amorphous silicon carbide is formed on at least the front face 10*a* of the initial substrate 10, namely on the porous layer 11 (FIG. 2C').

According to a third embodiment, a superficial layer 21 is formed on the front face 20*a* of the carrier substrate 20 and another superficial layer 12 is formed on the porous layer 11, itself positioned on the initial substrate 10.

In one or other of the aforementioned embodiments, the superficial layer 21, 12 could also be formed on the back face 20*b*, 10*b* of the substrates 20, 10 in question.

Irrespective of the embodiment, the superficial layer 21, 12 advantageously has a total thickness of less than or equal to 10 μm.

In order to form this superficial layer 21, 12, step c) comprises, according to a first variant, the deposition of an a-SiC layer on the substrate 20, 10 in question. The deposition of amorphous SiC may be carried out by a chemical vapor deposition (CVD) technique, for example, plasma-enhanced CVD (PECVD), or direct liquid injection CVD (DLI-CVD), by a physical vapor deposition technique, or by any other known technique. In the case of CVD deposition, a deposition temperature below 1100° C., or below 1000° C., is preferred. Regarding the deposition precursors (methane or silane chemistry), the C/Si ratio will preferably be chosen to be greater than or equal to 1.

The deposition techniques mentioned make it possible to form a superficial layer 21, 12, the thickness of which may typically vary between 100 nm and 10 μm, for example, around 1 μm. Similarly, the doping of the superficial layer 21, 12 made of a-SiC may be adjusted easily when it is formed by one of these techniques. It may notably be highly doped (usually of n-type, but optionally of p-type): for this, it comprises dopant species in a concentration of greater than $10^{19}/cm^3$, or of greater than $10^{20}/cm^3$. It should be remembered that the superficial layer 21, 12 is intended to be crystallized, at least partially, in single-crystal form, in order to form the thin layer 1 of the composite structure 100. Thus, it may be highly doped in order to give rise to a thin layer 1 having a low resistivity, depending on the requirements of the intended application.

According to a second variant, step c) comprises the amorphization of a surface layer of the substrate in question, in order to form the superficial layer 21, 12 made of a-SiC. This amorphization maybe carried out by a known technique, such as ion bombardment (for example, with Si or C ions) or neutron bombardment, with appropriate energies for forming an amorphous superficial layer 21, 12 having the desired thickness.

In the case of an amorphization of a surface layer of the substrate 20 (first embodiment and third embodiment), the polycrystalline structure of the carrier substrate 20 may be rendered amorphous, for example, by ion bombardment.

According to this second variant of formation of the superficial layer 21, 12, the thickness of the superficial layer 21, 12 is preferably less than 1 μm, typically on the order of a hundred to several hundreds of nanometers.

Figure 2D:
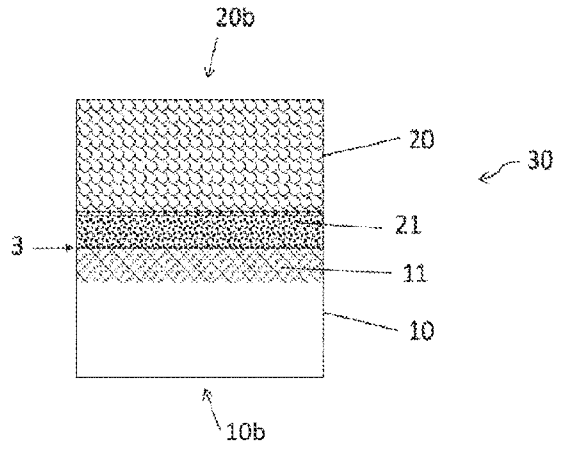
Figure 2D:
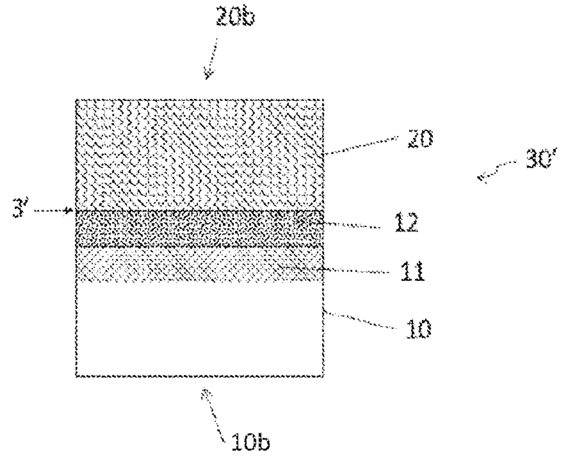
Figure 2D:
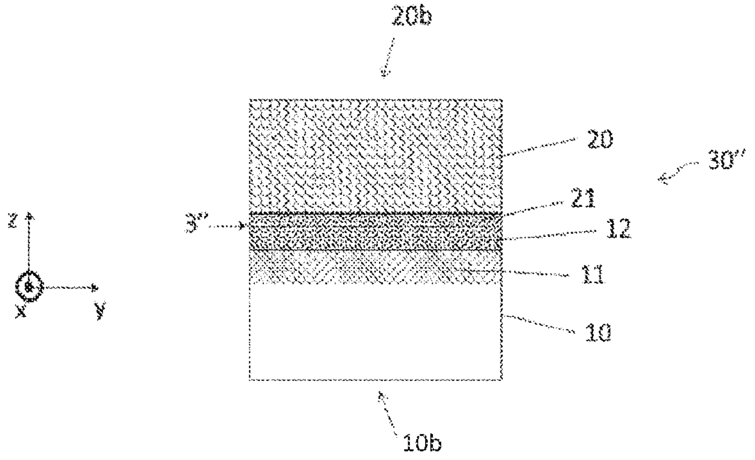

The fabrication process according to the present disclosure next comprises a step d) involving the joining of the initial substrate 10 and the carrier substrate 20 at their respective front faces 10*a*, 20*a* (FIG. 2D, FIG. 2D', FIG. 2D").

In the first embodiment (FIG. 2D), the porous layer 11 and the superficial layer 21 are thus joined along a bonding interface 3, leading to a first intermediate structure 30 being obtained.

In the second embodiment (FIG. 2D'), the superficial layer 12 is joined to the carrier substrate 20, along a bonding interface 3', leading to a first intermediate structure 30' being obtained.

Lastly, in the third embodiment (FIG. 2D"), the superficial layers 22, 12 respectively formed on the carrier substrate 20 and the porous layer 11 are joined along a bonding interface 3", leading to a first intermediate structure 30" being obtained.

As will be specified below, irrespective of the embodiment, the bonding interface 3, 3', 3", in step d), may involve direct contact between the surfaces joined or indirect contact between the surfaces joined, via a bonding layer.

The joining of step d) is based on direct bonding by molecular adhesion. As is well known per se, such bonding does not require an adhesive material, as bonds are made at the atomic level between the joined surfaces. Several types of molecular adhesion bonding exist, which differ, in particular, in terms of their temperature, pressure, atmosphere conditions or treatments prior to bringing the surfaces into contact. Mention may be made of room-temperature bonding with or without prior plasma activation of the surfaces to be joined, atomic diffusion bonding (ADB), surface-activated bonding (SAB), etc.

The joining step d) can comprise, prior to bringing the faces to be joined into contact, conventional sequences of chemical cleaning (for example, RCA cleaning) and of surface activation (for example, by way of oxygen or nitrogen plasma) or other surface preparations (such as scrubbing), which are likely to promote the quality of the bonding interface 3, 3', 3" (low defect density, high adhesion energy).

As mentioned previously, step d) may optionally comprise, prior to bringing the faces of the substrates 20, 10 to be joined into contact, the formation of a bonding layer on one and/or the other of the faces. The bonding layer may therefore be deposited (for example, by chemical vapor deposition CVD) on the porous layer 11 and/or on the superficial layer 21 (in the first embodiment), directly on the carrier substrate 20 and/or on the superficial layer 12 (in the second embodiment) or on one and/or the other of the superficial layers 21, 12 (in the third embodiment).

The bonding layer may be composed of at least one material chosen from silicon, nickel, titanium, tungsten, etc. The bonding layer is preferably of reduced thickness. Typically, the total thickness of the bonding layer is less than or equal to 10 nm, or less than or equal to 5 nm. In the first embodiment, the bonding layer may have a small thickness enabling the segmentation thereof in the form of nodules or the dissolution thereof during the heat treatment of the subsequent step e). This then provides a direct contact, at least locally, between the porous layer 11 and the superficial layer 21. this direct contact is essential for the correct implementation of the crystallization taking place in the next step e). If the bonding layer is made of semiconductor material (such as silicon, in particular), it could be doped so as to promote vertical electrical conduction.

As illustrated in FIG. 2D, the first intermediate structure 30 resulting from step d), in the first embodiment of the present disclosure, comprises, starting from the carrier substrate 20, and therefore in a reverse order to that seen in the figure:

- a carrier substrate 20 made of polycrystalline silicon carbide with a back face 20*b*,
- a superficial layer 21 made of amorphous silicon carbide, on the carrier substrate 20, on the front face 20*a* side thereof,
- a porous layer 11 positioned, directly in contact or via a bonding layer, on the superficial layer 21, a bonding interface 3 being present between the porous layer 11 and the superficial layer 21, an initial substrate 10 made of single-crystal silicon carbide on and in contact with the porous layer 11.

FIG. 2D' illustrates the first intermediate structure 30' resulting from step d), in the second embodiment of the present disclosure; it comprises:

- a carrier substrate 20 made of polycrystalline silicon carbide,
- a superficial layer 12 made of amorphous silicon carbide, positioned, directly in contact or via a bonding layer, on the carrier substrate 20, on the front face 20*a* side thereof, a bonding interface 3' being present between the carrier substrate 20 and the superficial layer 12,
- a porous layer 11 on the superficial layer 12,
- an initial substrate 10 made of single-crystal silicon carbide on and in contact with the porous layer 11.

Lastly, FIG. 2D" illustrates the first intermediate structure 30" resulting from step d), in the third embodiment of the present disclosure; it comprises:

- a carrier substrate 20 made of polycrystalline silicon carbide,
- a superficial layer 21 made of amorphous silicon carbide, on the carrier substrate 20, on the front face 20*a* side thereof,
- another superficial layer 12 made of amorphous silicon carbide, positioned, directly in contact or via a bonding layer, on the superficial layer 21, a bonding interface 3" being present between the two superficial layers 21, 12,
- a porous layer 11 on the superficial layer 12,
- an initial substrate 10 made of single-crystal silicon carbide on and in contact with the porous layer 11.

Figure 2E:
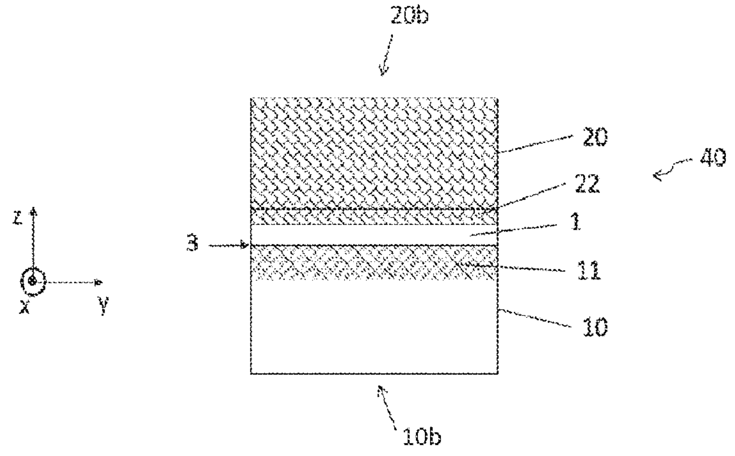

The next step e) of the fabrication process involves a heat treatment applied to the first intermediate structure 30, 30', 30", at a temperature above 900° C., in order to crystallize the superficial layer 21, 12 (FIG. 2E). The temperature of the heat treatment is advantageously greater than or equal to 1000° C., or greater than or equal to 1400° C., or even greater than or equal to 1850° C. By way of example, for a 1 μm superficial layer 21, 12 made of a-SiC, a heat treatment at 1700° C. for 30 min may be applied.

The superficial layer 21, 12 crystallizes, via a solid-phase epitaxy phenomenon, in the form of single-crystal silicon carbide, starting from an interface of direct contact between the porous layer 11 (the SiC of which has a single-crystal structure) and the superficial layer 21, 12 made of a-SiC. The superficial layer crystallized in single-crystal form forms the thin layer 1.

It may be that only a portion of the superficial layer 21, 12 crystallizes in single-crystal form. This is because the crystallization may occur at least partly in the form of polycrystalline silicon carbide, starting from the contact interface with the carrier substrate 20. An intermediate layer 22 is then formed, extension of p-SiC of the carrier substrate 20 up to the thin layer 1 made of c-SiC. In other words, the intermediate layer 22 is interposed between the carrier substrate 20 and the thin layer 1. The interface between the intermediate layer 22 and the thin layer 1 has the advantage of being perfectly closed as it is defined from the same a-Si material (superficial layer(s) 21, 12) by the meeting of the c-SiC and p-SiC crystallization fronts. This is an interesting advantage compared to a bonding interface between two materials of different crystalline nature (p-SiC/c-SiC, for example), the complete closure of which is notably dependent on the roughness and surface finish of the materials before joining.

In order to obtain such an intermediate layer 22, provision is notably made, if no superficial layer 21 is present on the carrier substrate 20 (i.e., in the second embodiment), for the superficial layer 12 made of a-Si (on the porous layer 11 side) to be in direct contact with the carrier substrate 20, in the absence of a bonding layer or by the use of a discontinuous bonding layer, for example, a bonding layer that forms a set of nodules between which the carrier substrate 20 is in direct contact with the superficial layer 12.

Step e) leads to a second intermediate structure 40 being obtained, irrespective of the embodiment implemented, in which structure all or part of the superficial layer(s) 21, 12 is crystallized in single-crystal form in order to form the thin layer 1 (FIG. 2E).

Figure 2F:
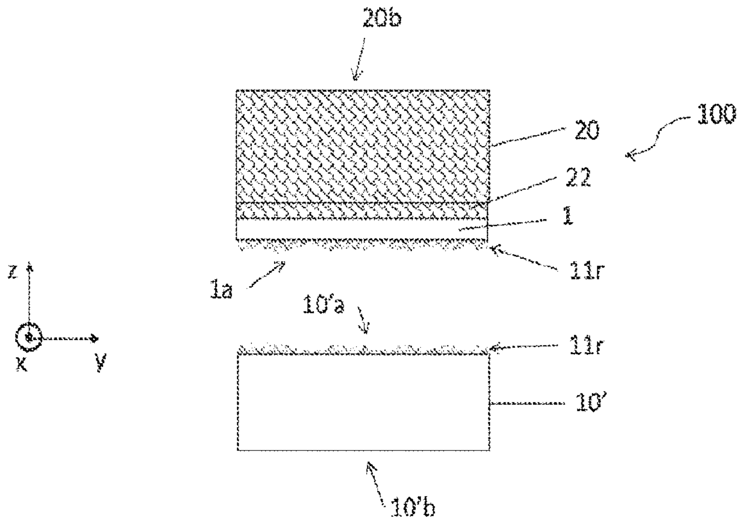

The fabrication process finally comprises a step f) of separation in the porous layer 11 of the second intermediate structure 40, in order to obtain the composite structure 100 on the one hand and the remainder 10' of the initial substrate on the other hand (FIG. 2F).

The separation step f) is carried out by applying a mechanical stress to the second intermediate structure 40. The stress may be exerted by the pressing and/or inserting of a tool (for example, a blade or other beveled shape) on the edge of the intermediate structure 40, opposite the porous layer 11. Alternatively, the mechanical stress may be applied by waterjet or air jet, directed toward the edge of the structure 40, still opposite the porous layer 11. Irrespective of the separation technique used, the mechanical stress applied must be suitable for propagating a fracture wave in the porous layer 11, which is of lower mechanical strength compared to the other layers or interfaces in the second intermediate structure 40.

By taking care to protect the free faces of the second intermediate structure 40, the separation could optionally be promoted by lateral chemical etching of the porous layer 11.

At the end of the separation step f), the free face 1*a* of the thin layer 1 of the composite structure 100 may have residues 11*r* of porous layer (FIG. 2F), in the same way as the front face 10'*a* of the remainder 10' of initial substrate.

Figure 2G:
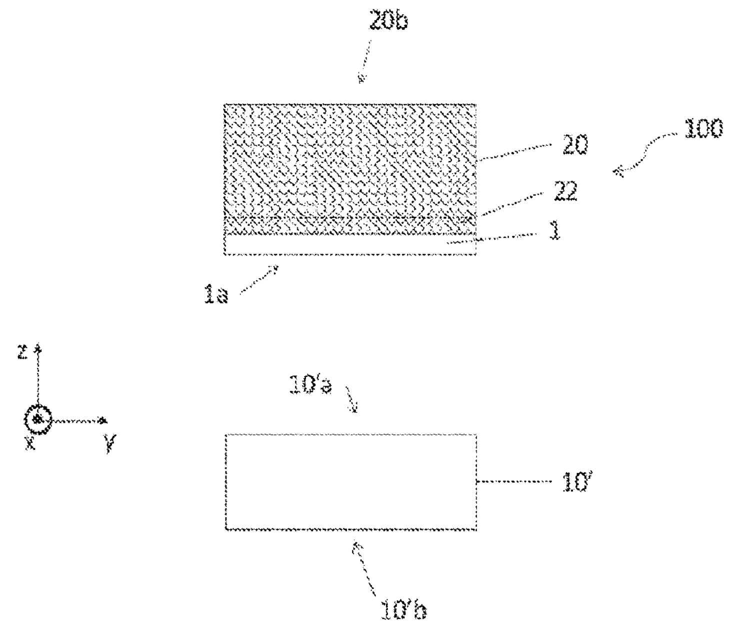

The process according to the present disclosure may therefore comprise a step g) of mechanical and/or chemical treatment(s) of the composite structure 100, in order to remove residues 11*r* of porous layer 11 from the front free face 1*a* of the thin layer 1 and/or to correct the thickness uniformity of the composite structure 100 (FIG. 2G).

The step g) may comprise a chemical mechanical polishing (CMP) and/or a chemical or plasma treatment (etching or cleaning) and/or a mechanical treatment (grinding), in order to remove the residue 11*r*.

The step g) may also comprise cleaning operations of Caro (piranha etch) and/or SC1/SC2 (Standard Clean 1, Standard Clean 2) and/or HF (hydrofluoric acid) type, or an $N_2$, Ar or $CF_4$ plasma, to further improve the quality of the free face 1*a* of the thin layer 1.

The step g) may comprise a heat treatment, applied to the composite structure 100, at a temperature of between 1000° C. and 1900° C., for around one hour and up to several hours. This heat treatment may be carried out before or after the abovementioned mechanical and/or chemical treatments (s). The objective of the heat treatment is to stabilize the composite structure 100 by noticeably developing, where appropriate, the crystalline quality of the thin layer 1, such that the structure 100 is perfectly compatible with subsequent heat treatments at very high temperatures, which are required for the fabrication of components on and/or in the layer 1.

Lastly, the fabrication process may comprise a step of reconditioning the remainder 10' of the initial substrate for reuse as initial substrate 10 for a new composite structure 100 (FIG. 2G). Mechanical and/or chemical treatments, similar to those applied to the composite structure 100 to remove the residue 11_r_, may be applied to the front face 10'_a_ of the remaining substrate 10'. The reconditioning step may also comprise one or more treatments of the edges of the remaining substrate 10' and/or of its back face 10'_b_, by chemical-mechanical polishing, grinding, and/or dry or wet chemical etching.

Of course, the present disclosure is not limited to the embodiments and to the examples that have been described, and variant embodiments can be added to it without departing from the scope of the invention as defined by the claims.

The invention claimed is:

1. A method of fabricating a composite structure including a thin layer of single-crystal silicon carbide on a carrier substrate of polycrystalline silicon carbide comprises:

providing an initial substrate of single-crystal silicon carbide having a front face and a back face, and providing the carrier substrate of polycrystalline silicon carbide having a front face and a back face;

forming a porous layer at least on the front face side of the initial substrate, the porous layer extending into the initial substrate from the front face;

forming a superficial layer of amorphous silicon carbide on the front face of the carrier substrate and/or on the porous layer;

joining the initial substrate and the carrier substrate at respective front faces thereof to form a first intermediate structure;

after forming the porous layer, the superficial layer, and the first intermediate structure, heat treating the first intermediate structure at a temperature above 900° C. to crystallize the superficial layer, at least partly in the form of single-crystal silicon carbide, starting from a contact interface with the porous layer to form the thin layer and to form a second intermediate structure;

separating in the porous layer of the second intermediate structure to form the composite structure and a remainder of the initial substrate.

2. The method of claim 1, wherein, after forming the porous layer, the porous layer has a thickness of between 0.5 μm and 5 μm.

3. The method of claim 1, wherein, after forming the porous layer, the porous layer comprises pores, a size of which is between 1 nm and 50 nm, and the porous layer has a degree of porosification of between 10% and 70%.

4. The method of claim 1, wherein, after forming the superficial layer of amorphous silicon carbide, the superficial layer of amorphous silicon carbide has a thickness of less than or equal to 10 μm.

5. The method of claim 4, wherein, after forming the superficial layer of amorphous silicon carbide, the superficial layer of amorphous silicon carbide has a thickness of less than or equal to 1 μm.

6. The method of claim 1, wherein the forming of the superficial layer of amorphous silicon carbide further comprises depositing an amorphous silicon carbide layer at least on the front face side of the carrier substrate and/or at least on the porous layer.

7. The method of claim 6, wherein the deposited amorphous silicon carbide layer has a concentration of dopant species greater than $10^{19}/cm^3$.

8. The method of claim 1, wherein the forming of the superficial layer of amorphous silicon carbide further comprises amorphization of a surface layer of the carrier substrate, at least on the front face side thereof.

9. The method of claim 1, further comprising, prior to the joining of the initial substrate and the carrier substrate, the formation of a bonding layer on the initial substrate and/or the carrier substrate, the bonding layer having, after the joining, a total thickness of less than or equal to 10 nm.

10. The method of claim 9, wherein the bonding layer is composed of at least one material chosen from among the group consisting of silicon, nickel, titanium, and tungsten.

11. The method of claim 9, wherein, during the heat treating, the bonding layer is segmented into nodules or is at least partially dissolved to allow at least localized direct contact between the superficial layer and the porous layer or between the superficial layer and the carrier substrate.

12. The method of claim 1, wherein the heat treating is carried out at a temperature above or equal to 1000° C.

13. The method of claim 1, wherein, during the heat treating, the crystallization of the superficial layer occurs at least partly in the form of polycrystalline silicon carbide, starting from a contact interface with the carrier substrate to form an intermediate layer.

14. The method of claim 1, further comprising, after the separating, performing mechanical and/or chemical treatment(s) on the composite structure to eliminate residues of the porous layer from the front face of the thin layer and/or to correct a thickness uniformity of the composite structure.

15. The method of claim 14, further comprising heat treating the composite structure at a temperature of between 1000° C. and 1900° C. before or after the mechanical and/or chemical treatment(s).

16. The method of claim 1, further comprising reconditioning the remainder of the initial substrate for reuse as an initial substrate for the fabrication of another composite structure.

17. An intermediate structure, comprising:

a carrier substrate of polycrystalline silicon carbide;

at least one superficial layer of amorphous silicon carbide on a front face side of the carrier substrate;

a porous layer on the at least one superficial layer; and an initial substrate of single-crystal silicon carbide, the porous layer being a portion of the initial substrate and the porous layer extends from a front face side into the initial substrate;

wherein the porous layer is positioned, directly in contact or via a bonding layer, on the at least one superficial layer, a bonding interface being present between the porous layer and the at least one superficial layer; or wherein the superficial layer is positioned, directly in contact or via a bonding layer, on the carrier substrate, a bonding interface being present between the carrier substrate and the at least one superficial layer; or wherein the at least one superficial layer includes a first superficial layer on the porous layer and a second superficial layer on the carrier substrate, the first superficial layer positioned, directly in contact or via a bonding layer, on the second superficial layer, a bonding interface being present between the first superficial layer and the second superficial layer.

18. The method of claim 7, wherein the deposited amorphous silicon carbide layer has a concentration of dopant species greater than $10^{20}/cm^3$.

19. The method of claim 12, wherein the heat treating is carried out at a temperature above or equal to 1400° C.

20. The method of claim 19, wherein the heat treating is carried out at a temperature above or equal to 1850° C.

* * * * *